United States Patent
Miles et al.

(10) Patent No.: US 7,221,495 B2
(45) Date of Patent: May 22, 2007

(54) THIN FILM PRECURSOR STACK FOR MEMS MANUFACTURING

(75) Inventors: Mark W. Miles, San Francisco, CA (US); Brian J. Gally, San Rafael, CA (US); Clarence Chui, San Mateo, CA (US)

(73) Assignee: IDC LLC, San Francisco, CA (US)

(*) Notice: Subject to any disclaimer, the term of this patent is extended or adjusted under 35 U.S.C. 154(b) by 321 days.

(21) Appl. No.: 10/606,001

(22) Filed: Jun. 24, 2003

(65) Prior Publication Data

US 2004/0263944 A1 Dec. 30, 2004

(51) Int. Cl.
*G02B 26/00* (2006.01)
*C23F 1/00* (2006.01)

(52) U.S. Cl. .................... 359/290; 359/291; 216/2

(58) Field of Classification Search ......... 359/290–298; 427/162–248.1; 430/319, 320, 321; 216/2
See application file for complete search history.

(56) References Cited

U.S. PATENT DOCUMENTS

| | | | |
|---|---|---|---|
| 2,534,846 A | 12/1950 | Ambrose et al. | 348/270 |
| 3,439,973 A | 4/1969 | Paul et al. | 359/486 |
| 3,443,854 A | 5/1969 | Weiss | 359/352 |
| 3,653,741 A | 4/1972 | Marks | 359/486 |
| 3,656,836 A | 4/1972 | de Cremoux et al. | 359/261 |
| 3,725,868 A | 4/1973 | Maimer, Jr. et al. | 712/245 |
| 3,813,265 A | 5/1974 | Marks | 427/473 |
| 3,955,880 A | 5/1976 | Lierke | 359/291 |
| 4,099,854 A | 7/1978 | Decker et al. | 359/278 |
| 4,198,396 A | 4/1980 | Smith | 359/336 |
| 4,228,437 A | 10/1980 | Shelton | 343/303 |

(Continued)

FOREIGN PATENT DOCUMENTS

| | | |
|---|---|---|
| DE | 102 28 946 A | 1/2004 |
| EP | 0 667 548 A1 | 8/1995 |
| JP | 05275401 A1 | 10/1993 |
| WO | WO 95/30924 | 11/1995 |
| WO | WO9530924 | 11/1995 |
| WO | WO9717628 | 5/1997 |
| WO | WO 97/17628 | 5/1997 |
| WO | WO 99/52006 A3 | 10/1999 |
| WO | WO 99/52006 A2 | 10/1999 |
| WO | WO0114248 | 3/2001 |
| WO | WO 03/007049 A1 | 1/2003 |
| WO | WO 03/069413 A1 | 8/2003 |
| WO | WO 03/073151 A1 | 9/2003 |
| WO | WO 2004/006003 A1 | 1/2004 |
| WO | WO 2004/026757 A2 | 4/2004 |

OTHER PUBLICATIONS

International Search Report for PCT/US04/20330 mailed on Nov. 8, 2004.
Written Opinion for PCT/US04/20330 mailed on Nov. 8, 2004.
Akasaka, "Three–Dimensional IC Trends", Proceedings of IEEE, vol. 74, No. 12, pp. 1703–1714, (Dec. 1986).
Aratani et al., "Process and Design Considerations for Surface Micromachined Beams for a Tuneable Interferometer Array in Silicon," Proc. IEEE Microelectromechanical Workshop, Fort Lauderdale, FL. pp. 230–235 (Feb. 1993).

(Continued)

*Primary Examiner*—Huy Mai
*Assistant Examiner*—M. Hasan
(74) *Attorney, Agent, or Firm*—Knobbe Martens Olson & Bear LLP

(57) ABSTRACT

This invention provides a precursor film stack for use in the production of MEMS devices. The precursor film stack comprises a carrier substrate, a first layer formed on the carrier substrate, a second layer of an insulator material formed on the first layer, and a third layer of a sacrificial material formed on the second layer.

29 Claims, 4 Drawing Sheets

U.S. PATENT DOCUMENTS

| | | | |
|---|---|---|---|
| 4,377,324 A | 3/1983 | Durand et al. | 359/578 |
| 4,389,096 A | 6/1983 | Hori et al. | 349/5 |
| 4,403,248 A | 9/1983 | Te Velde | 348/775 |
| 4,441,791 A | 4/1984 | Hornbeck | 359/295 |
| 4,445,050 A | 4/1984 | Marks | 307/145 |
| 4,459,182 A | 7/1984 | te Velde | 205/122 |
| 4,482,213 A | 11/1984 | Piliavin et al. | 349/153 |
| 4,500,171 A | 2/1985 | Penz et al. | 349/190 |
| 4,519,676 A | 5/1985 | te Velde | 359/223 |
| 4,531,126 A | 7/1985 | Sadones | 210/108 |
| 4,566,935 A | 1/1986 | Hornbeck | 438/29 |
| 4,571,603 A | 2/1986 | Hornbeck et al. | 347/239 |
| 4,596,992 A | 6/1986 | Hornbeck | 347/134 |
| 4,615,595 A | 10/1986 | Hornbeck | 353/122 |
| 4,662,746 A | 5/1987 | Hornbeck | 359/223 |
| 4,663,083 A | 5/1987 | Marks | 252/583 |
| 4,681,403 A | 7/1987 | Te Velde et al. | 349/41 |
| 4,710,732 A | 12/1987 | Hornbeck | 359/291 |
| 4,748,366 A | 5/1988 | Taylor | 310/328 |
| 4,786,128 A | 11/1988 | Birnbach | 385/8 |
| 4,790,635 A | 12/1988 | Apsley | 359/260 |
| 4,856,863 A | 8/1989 | Sampsell et al. | 385/4 |
| 4,937,496 A | 6/1990 | Neiger et al. | 313/632 |
| 4,954,789 A | 9/1990 | Sampsell | 359/318 |
| 4,956,619 A | 9/1990 | Hornbeck | 359/317 |
| 4,982,184 A | 1/1991 | Kirkwood | 345/84 |
| 5,018,256 A | 5/1991 | Hornbeck | 438/23 |
| 5,022,745 A | 6/1991 | Zayhowski et al. | 359/847 |
| 5,028,939 A | 7/1991 | Hornbeck et al. | 347/131 |
| 5,037,173 A | 8/1991 | Sampsell et al. | 385/17 |
| 5,044,736 A | 9/1991 | Jaskie et al. | 359/291 |
| 5,061,049 A | 10/1991 | Hornbeck | 359/224 |
| 5,075,796 A | 12/1991 | Schildkraut et al. | 359/247 |
| 5,078,479 A | 1/1992 | Vuilleumier | 359/290 |
| 5,079,544 A | 1/1992 | DeMond et al. | 345/84 |
| 5,083,857 A | 1/1992 | Hornbeck | 359/291 |
| 5,096,279 A | 3/1992 | Hornbeck et al. | 359/230 |
| 5,099,353 A | 3/1992 | Hornbeck | 359/291 |
| 5,124,834 A | 6/1992 | Cusano et al. | 359/291 |
| 5,136,669 A | 8/1992 | Gerdt | 385/39 |
| 5,142,405 A | 8/1992 | Hornbeck | 359/226 |
| 5,142,414 A | 8/1992 | Koehler | 359/578 |
| 5,153,771 A | 10/1992 | Link et al. | 359/291 |
| 5,162,787 A | 11/1992 | Thompson et al. | 345/32 |
| 5,168,406 A | 12/1992 | Nelson | 359/855 |
| 5,170,156 A | 12/1992 | DeMond et al. | 345/85 |
| 5,172,262 A | 12/1992 | Hornbeck | 359/223 |
| 5,179,274 A | 1/1993 | Sampsell | 250/200.2 |
| 5,192,395 A | 3/1993 | Boysel et al. | 216/13 |
| 5,192,946 A | 3/1993 | Thompson et al. | 348/764 |
| 5,206,629 A | 4/1993 | DeMond et al. | 345/206 |
| 5,214,419 A | 5/1993 | DeMond et al. | 345/32 |
| 5,214,420 A | 5/1993 | Thompson et al. | 345/6 |
| 5,216,537 A | 6/1993 | Hornbeck | 438/23 |
| 5,226,099 A | 7/1993 | Mignardi et al. | 385/19 |
| 5,228,013 A | 7/1993 | Bik | 368/223 |
| 5,231,532 A | 7/1993 | Magel et al. | 359/295 |
| 5,233,385 A | 8/1993 | Sampsell | 355/35 |
| 5,233,456 A | 8/1993 | Nelson | 359/214 |
| 5,233,459 A | 8/1993 | Bozler et al. | 359/230 |
| 5,254,980 A | 10/1993 | Hendrix et al. | 345/84 |
| 5,272,473 A | 12/1993 | Thompson et al. | 345/7 |
| 5,278,652 A | 1/1994 | Urbanus et al. | 348/571 |
| 5,280,277 A | 1/1994 | Hornbeck | 345/107 |
| 5,287,096 A | 2/1994 | Thompson et al. | 345/697 |
| 5,296,950 A | 3/1994 | Lin et al. | 359/9 |
| 5,305,640 A | 4/1994 | Boysel et al. | 73/514.16 |
| 5,311,360 A | 5/1994 | Bloom et al. | 359/572 |
| 5,312,513 A | 5/1994 | Florence et al. | 216/24 |
| 5,323,002 A | 6/1994 | Sampsell et al. | 250/252.1 |
| 5,324,683 A | 6/1994 | Fitch et al. | 438/422 |
| 5,325,116 A | 6/1994 | Sampsell | 347/255 |
| 5,326,430 A | 7/1994 | Cronin et al. | 438/584 |
| 5,327,286 A | 7/1994 | Sampsell et al. | 359/561 |
| 5,331,454 A | 7/1994 | Hornbeck | 359/224 |
| 5,339,116 A | 8/1994 | Urbanus et al. | 348/716 |
| 5,345,328 A | 9/1994 | Fritz et al. | 359/248 |
| 5,365,283 A | 11/1994 | Doherty et al. | 348/743 |
| 5,381,232 A | 1/1995 | van Wijk | 356/519 |
| 5,381,253 A | 1/1995 | Sharp et al. | 349/18 |
| 5,401,983 A | 3/1995 | Jokerst et al. | 257/8 |
| 5,411,769 A | 5/1995 | Hornbeck | 427/534 |
| 5,444,566 A | 8/1995 | Gale et al. | 359/291 |
| 5,446,479 A | 8/1995 | Thompson et al. | 345/6 |
| 5,448,314 A | 9/1995 | Heimbuch et al. | 348/743 |
| 5,452,024 A | 9/1995 | Sampsell | 348/755 |
| 5,454,906 A | 10/1995 | Baker et al. | 216/66 |
| 5,457,493 A | 10/1995 | Leddy et al. | 348/164 |
| 5,457,566 A | 10/1995 | Sampsell et al. | 359/292 |
| 5,459,602 A | 10/1995 | Sampsell | 359/234 |
| 5,459,610 A | 10/1995 | Bloom et al. | 359/572 |
| 5,461,411 A | 10/1995 | Florence et al. | 347/240 |
| 5,489,952 A | 2/1996 | Gove et al. | 348/771 |
| 5,497,172 A | 3/1996 | Doherty et al. | 345/85 |
| 5,497,197 A | 3/1996 | Gove et al. | 348/388.1 |
| 5,499,062 A | 3/1996 | Urbanus | 348/771 |
| 5,500,635 A | 3/1996 | Mott | 340/323 R |
| 5,500,761 A | 3/1996 | Goossen et al. | 359/290 |
| 5,503,952 A | 4/1996 | Suzuki et al. | 430/7 |
| 5,506,597 A | 4/1996 | Thompson et al. | 345/85 |
| 5,515,076 A | 5/1996 | Thompson et al. | 345/505 |
| 5,517,347 A | 5/1996 | Sampsell | 359/224 |
| 5,523,803 A | 6/1996 | Urbanus et al. | 348/771 |
| 5,526,051 A | 6/1996 | Gove et al. | 375/240.01 |
| 5,526,172 A | 6/1996 | Kanack | 359/291 |
| 5,526,327 A | 6/1996 | Cordova, Jr. | 368/82 |
| 5,526,688 A | 6/1996 | Boysel et al. | 73/514.38 |
| 5,535,047 A | 7/1996 | Hornbeck | 359/295 |
| 5,548,301 A | 8/1996 | Kornher et al. | 345/85 |
| 5,551,293 A | 9/1996 | Boysel et al. | 73/514.14 |
| 5,552,924 A | 9/1996 | Tregilgas | 359/224 |
| 5,552,925 A | 9/1996 | Worley | 359/230 |
| 5,563,398 A | 10/1996 | Sampsell | 235/454 |
| 5,567,334 A | 10/1996 | Baker et al. | 216/24 |
| 5,570,135 A | 10/1996 | Gove et al. | 348/581 |
| 5,579,149 A | 11/1996 | Moret et al. | 359/223 |
| 5,581,272 A | 12/1996 | Conner et al. | 345/85 |
| 5,583,688 A | 12/1996 | Hornbeck | 359/291 |
| 5,589,852 A | 12/1996 | Thompson et al. | 345/690 |
| 5,597,736 A | 1/1997 | Sampsell | 438/22 |
| 5,600,383 A | 2/1997 | Hornbeck | 348/771 |
| 5,602,671 A | 2/1997 | Hornbeck | 359/224 |
| 5,606,441 A | 2/1997 | Florence et al. | 349/33 |
| 5,608,468 A | 3/1997 | Gove et al. | 348/771 |
| 5,610,438 A | 3/1997 | Wallace et al. | 257/682 |
| 5,610,624 A | 3/1997 | Bhuva | 345/84 |
| 5,610,625 A | 3/1997 | Sampsell | 345/84 |
| 5,619,059 A | 4/1997 | Li et al. | 257/431 |
| 5,619,365 A | 4/1997 | Rhoads et al. | 359/248 |
| 5,619,366 A | 4/1997 | Rhoads et al. | 359/248 |
| 5,622,814 A | 4/1997 | Miyata et al. | 430/314 |
| 5,629,790 A | 5/1997 | Neukermans et al. | 359/198 |
| 5,633,652 A | 5/1997 | Kanbe et al. | 345/97 |
| 5,636,052 A | 6/1997 | Arney et al. | 359/291 |
| 5,636,185 A | 6/1997 | Brewer et al. | 368/84 |
| 5,638,084 A | 6/1997 | Kalt | 345/31 |
| 5,638,946 A | 6/1997 | Zavracky | 200/181 |
| 5,641,391 A | 6/1997 | Hunter et al. | 205/80 |
| 5,646,768 A | 7/1997 | Kaeriyama | 359/224 |
| 5,650,881 A | 7/1997 | Hornbeck | 359/871 |
| 5,654,741 A | 8/1997 | Sampsell et al. | 345/158 |

| Patent No. | Date | Inventor | Class |
|---|---|---|---|
| 5,657,099 A | 8/1997 | Doherty et al. | 348/743 |
| 5,659,374 A | 8/1997 | Gale, Jr. et al. | 348/771 |
| 5,665,997 A | 9/1997 | Weaver et al. | 257/414 |
| 5,673,139 A | 9/1997 | Johnson | 359/291 |
| 5,674,757 A | 10/1997 | Kim | 438/159 |
| 5,683,591 A | 11/1997 | Offenberg | 216/2 |
| 5,703,710 A | 12/1997 | Brinkman et al. | 359/283 |
| 5,710,656 A | 1/1998 | Goossen | 359/291 |
| 5,726,480 A | 3/1998 | Pister | 257/415 |
| 5,739,945 A | 4/1998 | Tayebati | 359/291 |
| 5,745,193 A | 4/1998 | Urbanus et al. | 348/771 |
| 5,745,281 A | 4/1998 | Yi et al. | 359/290 |
| 5,771,116 A | 6/1998 | Miller et al. | 359/295 |
| 5,784,190 A | 7/1998 | Worley | 359/291 |
| 5,784,212 A | 7/1998 | Hornbeck | 359/871 |
| 5,793,504 A | 8/1998 | Stoll | 359/11 |
| 5,808,780 A | 9/1998 | McDonald | 359/290 |
| 5,818,095 A | 10/1998 | Sampsell | 257/435 |
| 5,825,528 A | 10/1998 | Goossen | 359/291 |
| 5,835,255 A | 11/1998 | Miles | 359/291 |
| 5,842,088 A | 11/1998 | Thompson | 399/177 |
| 5,912,758 A | 6/1999 | Knipe et al. | 359/290 |
| 5,943,158 A | 8/1999 | Ford et al. | 359/295 |
| 5,959,763 A | 9/1999 | Bozler et al. | 359/290 |
| 5,972,193 A | 10/1999 | Chou et al. | 205/122 |
| 5,976,902 A | 11/1999 | Shih | 438/30 |
| 5,986,796 A | 11/1999 | Miles | 359/260 |
| 6,028,690 A | 2/2000 | Carter et al. | 359/224 |
| 6,038,056 A | 3/2000 | Florence et al. | 359/290 |
| 6,040,937 A | 3/2000 | Miles | 359/291 |
| 6,049,317 A | 4/2000 | Thompson et al. | 345/85 |
| 6,055,090 A | 4/2000 | Miles | 359/291 |
| 6,061,075 A | 5/2000 | Nelson et al. | 347/174 |
| 6,099,132 A | 8/2000 | Kaeriyama | 359/872 |
| 6,100,872 A | 8/2000 | Aratani et al. | 345/589 |
| 6,113,239 A | 9/2000 | Sampsell et al. | 353/31 |
| 6,147,790 A | 11/2000 | Meier et al. | 359/291 |
| 6,160,833 A | 12/2000 | Floyd et al. | 372/96 |
| 6,180,428 B1 | 1/2001 | Peeters et al. | 438/22 |
| 6,195,196 B1 | 2/2001 | Kimura et al. | 359/295 |
| 6,201,633 B1 | 3/2001 | Peeters et al. | 359/296 |
| 6,232,936 B1 | 5/2001 | Gove et al. | 345/85 |
| 6,243,149 B1 | 6/2001 | Swanson et al. | 349/62 |
| 6,282,010 B1 | 8/2001 | Sulzbach et al. | 359/249 |
| 6,284,560 B1 | 9/2001 | Jech et al. | 438/48 |
| 6,295,154 B1 | 9/2001 | Laor et al. | 359/223 |
| 6,323,982 B1 | 11/2001 | Hornbeck | 359/224 |
| 6,356,254 B1 | 3/2002 | Kimura | 345/108 |
| 6,376,787 B1 | 4/2002 | Martin et al. | 200/181 |
| 6,447,126 B1 | 9/2002 | Hornbeck | 359/871 |
| 6,452,465 B1 | 9/2002 | Brown et al. | 333/205 |
| 6,456,420 B1 * | 9/2002 | Goodwin-Johansson | 359/291 |
| 6,465,355 B1 | 10/2002 | Horsley | 438/694 |
| 6,466,358 B2 | 10/2002 | Tew | 359/292 |
| 6,473,274 B1 | 10/2002 | Maimone et al. | 360/294.5 |
| 6,480,177 B2 | 11/2002 | Doherty et al. | 345/84 |
| 6,496,122 B2 | 12/2002 | Sampsell | 340/825.69 |
| 6,545,335 B1 | 4/2003 | Chua et al. | 257/499 |
| 6,548,908 B2 | 4/2003 | Chua et al. | 257/773 |
| 6,549,338 B1 | 4/2003 | Wolverton et al. | 359/634 |
| 6,552,840 B2 | 4/2003 | Knipe | 359/291 |
| 6,574,033 B1 | 6/2003 | Chui et al. | 359/291 |
| 6,589,625 B1 | 7/2003 | Kothari et al. | 428/46 |
| 6,600,201 B2 | 7/2003 | Hartwell et al. | 257/415 |
| 6,606,175 B1 | 8/2003 | Sampsell et al. | 398/140 |
| 6,608,268 B1 | 8/2003 | Goldsmith | 200/181 |
| 6,625,047 B2 | 9/2003 | Coleman, Jr., deceased | 365/51 |
| 6,630,786 B2 | 10/2003 | Cummings et al. | 313/553 |
| 6,632,698 B2 | 10/2003 | Ives | 438/52 |
| 6,634,919 B2 | 10/2003 | Melendez et al. | 446/73 |
| 6,643,069 B2 | 11/2003 | Dewald | 359/629 |
| 6,650,455 B2 | 11/2003 | Miles | 359/237 |
| 6,657,832 B2 | 12/2003 | Williams et al. | 361/15 |
| 6,666,561 B1 | 12/2003 | Blakley | 359/877 |
| 6,674,562 B1 | 1/2004 | Miles | 359/291 |
| 6,680,792 B2 | 1/2004 | Miles | 359/291 |
| 6,710,908 B2 | 3/2004 | Miles et al. | 359/290 |
| 6,741,377 B2 | 5/2004 | Miles | 359/243 |
| 6,741,384 B1 | 5/2004 | Martin et al. | 359/291 |
| 6,741,503 B1 | 5/2004 | Farris et al. | 365/189.05 |
| 6,747,785 B2 | 6/2004 | Chen et al. | 359/291 |
| 6,747,800 B1 | 6/2004 | Lin | |
| 6,756,317 B2 | 6/2004 | Sniegowski et al. | 438/745 |
| 6,775,174 B2 | 8/2004 | Huffman et al. | 365/149 |
| 6,778,155 B2 | 8/2004 | Doherty et al. | 345/85 |
| 6,778,306 B2 | 8/2004 | Sniegowski et al. | 359/224 |
| 6,794,119 B2 | 9/2004 | Miles | 430/313 |
| 6,811,267 B1 | 11/2004 | Allen et al. | 353/122 |
| 6,812,482 B2 | 11/2004 | Fleming et al. | 257/17 |
| 6,819,469 B1 | 11/2004 | Koba | 359/290 |
| 6,822,628 B2 | 11/2004 | Dunphy et al. | 345/75.2 |
| 6,829,132 B2 | 12/2004 | Martin et al. | 361/278 |
| 6,853,129 B1 | 2/2005 | Cummings et al. | 313/495 |
| 6,855,610 B2 | 2/2005 | Tung et al. | 438/299 |
| 6,859,218 B1 | 2/2005 | Luman et al. | 347/139 |
| 6,862,022 B2 | 3/2005 | Slupe | 345/207 |
| 6,862,029 B1 | 3/2005 | D'Souza et al. | 345/690 |
| 6,867,896 B2 | 3/2005 | Miles | |
| 6,870,681 B1 | 3/2005 | Li et al. | 359/626 |
| 6,912,022 B2 | 6/2005 | Lin et al. | |
| 2001/0003487 A1 | 6/2001 | Miles | 359/260 |
| 2001/0040649 A1 | 11/2001 | Ozaki | 349/43 |
| 2002/0015215 A1 | 2/2002 | Miles | 359/290 |
| 2002/0071169 A1 * | 6/2002 | Bowers et al. | 359/291 |
| 2002/0075555 A1 | 6/2002 | Miles | 359/291 |
| 2002/0126364 A1 | 9/2002 | Miles | 359/247 |
| 2002/0135857 A1 | 9/2002 | Fitzpatrick et al. | 359/291 |
| 2003/0043157 A1 | 3/2003 | Miles | 345/540 |
| 2003/0062186 A1 | 4/2003 | Boroson et al. | 174/52.2 |
| 2003/0072070 A1 | 4/2003 | Miles | 359/260 |
| 2003/0152872 A1 | 8/2003 | Miles | 430/313 |
| 2003/0202264 A1 | 10/2003 | Weber et al. | 359/877 |
| 2003/0202265 A1 | 10/2003 | Reboa et al. | 359/877 |
| 2003/0202266 A1 | 10/2003 | Ring et al. | 359/877 |
| 2004/0028849 A1 * | 2/2004 | Stark et al. | 428/34.1 |
| 2004/0035821 A1 * | 2/2004 | Doan et al. | 216/2 |
| 2004/0051929 A1 | 3/2004 | Sampsell et al. | 359/247 |
| 2004/0058532 A1 | 3/2004 | Miles et al. | 438/689 |
| 2004/0061543 A1 * | 4/2004 | Nam et al. | 327/342 |
| 2004/0080807 A1 | 4/2004 | Chen et al. | 359/291 |
| 2004/0125281 A1 | 7/2004 | Lin | |
| 2004/0145049 A1 | 7/2004 | McKinnell et al. | 257/719 |
| 2004/0147056 A1 | 7/2004 | McKinnell et al. | 438/52 |
| 2004/0150869 A1 * | 8/2004 | Kasai | 359/290 |
| 2004/0160143 A1 | 8/2004 | Shreeve et al. | 310/309 |
| 2004/0174583 A1 | 9/2004 | Chen et al. | 359/290 |
| 2004/0179281 A1 | 9/2004 | Reboa | 359/872 |
| 2004/0212026 A1 | 10/2004 | Van Brocklin et al. | 257/414 |
| 2004/0217378 A1 | 11/2004 | Martin et al. | 257/200 |
| 2004/0217919 A1 | 11/2004 | Pichl et al. | 345/31 |
| 2004/0218251 A1 | 11/2004 | Piehl et al. | 359/290 |
| 2004/0218334 A1 | 11/2004 | Martin et al. | 361/139 |
| 2004/0218341 A1 | 11/2004 | Martin et al. | 361/278 |
| 2004/0227493 A1 | 11/2004 | Van Brocklin et al. | 320/166 |
| 2004/0240032 A1 | 12/2004 | Miles | 359/291 |
| 2004/0240138 A1 | 12/2004 | Martin et al. | 361/139 |
| 2004/0245588 A1 | 12/2004 | Nikkel et al. | 257/415 |
| 2004/0263944 A1 | 12/2004 | Miles et al. | 359/290 |
| 2005/0001828 A1 | 1/2005 | Martin et al. | 345/204 |

OTHER PUBLICATIONS

Aratani K., et al., "Surface micromachined tuneable interferometer array," Sensors and Actuators, pp. 17–23. (1994).
Conner, "Hybrid Color Display Using Optical Interference Filter Array," SID Digest, pp. 577–580 (1993).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18–25, (Jan./Feb. 1999).
Goossen et al., "Possible Display Applications of the Silicon Mechanical Anti–Reflection Switch," Society for Information Display (1994).
Goossen et al., "Silicon Modulator Based on Mechanically–Active Anti–Reflection Layer with 1Mbit/sec Capability for Fiber–in–the–Loop Applications," IEEE Photonics Technology Letters, pp. 1119–1121 (Sep.1994).
Gosch, "West Germany Grabs the Lead in X–Ray Lithography," Electronics pp. 78–80 (Feb. 5, 1987).
Howard et al., "Nanometer–Scale Fabrication Techniques," VLSI Electronics: Microstructure Science, vol. 5, pp. 145–153 and pp. 166–173 (1982).
Ibbotson et al., "Comparsion of XeF2 and F–atom reactions with Si and SiO2," Applied Physics Letters, vol. 44, No. 12, pp. 1129–1131 (Jun. 1984).
Jackson "Classical Electrodynamics", John Wiley & Sons Inc., pp. 568–573. (date unknown).
Jerman et al., "A Miniature Fabry–Perot Interferometer with a Corrugated Silicon Diaphragm Support", (1988).
Joannopoulos et al., "Photonic Crystals: Molding the Flow of Light," Princeton University Press (1995).
Johnson "Optical Scanners", Microwave Scanning Antennas, vol. 1, p. 251–261, (1964).
Kim et al., "Control of Optical Transmission Through Metals Perforated With Subwavelength Hole Arrays," Optics Letters, vol. 24, No. 4, pp. 256–257, (Feb. 1999).
Light over Matter, Circle No. 36 (Jun. 1993).
Lin et al., "Free–Space Micromachined Optical Switches for Optical Networking," IEEE Journal of Selected Topics in Quantum Electronics, vol. 5, No. 1, pp. 4–9, (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0–8194–2080–Mar. (1998).

Miles, Mark, W., "A New Reflective FPD Technology Using Interferometric Modulation", The Proceedings of the Society for Information Display (May 11–16, 1997).
Nagami et al., "Plastic Cell Architecture: Towards Reconfigurable Computing For General–Purpose," IEEE, 0–8186–8900–, pp. 68–77, (May 1998).
Newsbreaks, "Quantum–trench devices might operate at terahentz frequencies", Laser Focus World (May 1993).
Oliner et al., "Radiating Elements and Mutual Coupling", Microwave Scanning Antennas, vol. 2, pp. 131–141, (1966).
Raley et al., "A Fabry–Perot Microinterferometer for Visible Wavelenghts", IEEE Solid–State Sensor and Actuator Workshop, Jun. 1992, Hilton Head, SC.
Schnakenberg et al., "TMAHW Etchants for Silicon Micromachining," 1991 International Conference on Solid State Sensors and Actuators–Digest of Technical Papers, pp. 815–818 (1991).
Sperger et al., "High Performance Patterned All–Dielectric Interference Colour Filter for Display Applications", SID Digest, pp. 81–83, (1994).
Sriharan, et al. "Post–Packaging Release a New Concept for Surface–Micromachined Devices" Technical Digest, IEEE Solid–State Sensor & Actuator Workshop, New York, NY, US, Nov. 8, 1998, pp. 225–228, XP000992464.
Stone, "Radiation and Optics, An Introduction to the Classical Theory", McGraw–Hill, pp. 340–343, (1963).
Walker, et al., "Electron–beam–tunable Interference Filter Spatial Light Modulator", Optics Letters vol. 13, No. 5, pp. 345–347, (May 1988).
Williams et al., "Etch Rates for Micromachining Processing," Journal of Microelectromechanical Systems, vol. 5, No. 4, pp. 256–259 (Dec. 1996).
Winters et al., "The etching of silicon with XeF2 vapor, Applied Physics Letters," vol. 34, No. 1, pp. 70–73 (Jan. 1979).
Winton, John M., "A novel way to capture solar energy", Chemical Week, (May 1985).
Wu, "Design of a Reflective Color LCD Using Optical Interference Reflectors", ASIA Display '95, pp. 929–931, (Oct. 1995).
Zhou et al., "Waveguide Panel Display Using Electromechical Spatial Modulators" SID Digest, vol. XXIX, (1998).
PCT/US02/13442, Search Report (Sep. 13, 2002).
PCT/US2004/035820 International Search Report and Written Opinion (Apr. 11, 2005).
PCT/US96/17731 Search Report.

* cited by examiner

THIN FILM PRECURSOR STACK FOR MEMS MANUFACTURING

FIELD OF THE INVENTION

This invention relates generally to fabrication processes for microelectromechanical systems (MEMS) devices and more specifically to the manufacture of interferometric modulators.

BACKGROUND OF THE INVENTION

An interferometric modulator is a class of MEMS (microelectromechanical systems) devices which have been described and documented in a variety of patents including U.S. Pat. Nos. 5,835,255, 5,986,796, 6,040,937, 6,055,090, and U.S. Pending patent application Ser. Nos. 09/966,843, 09/974,544, 10/082,397, 10/084,893, and 10/878,282, herein incorporated by reference. One of the key attributes of these devices is the fact that they are fabricated monolithically using semiconductor-like fabrication processes. Specifically, these devices are manufactured in a sequence of steps which combine film deposition, photolithography, and etching using a variety of techniques. More detail on these processes is described in patent application Ser. No. No. 10/074,562 filed on Feb. 12, 2002, and herein incorporated by reference.

DETAILED DESCRIPTION OF THE INVENTION

In the following detailed description of embodiments of the invention, numerous specific details are set forth such as examples of specific materials, machines, and methods in order to provide a thorough understanding of the present invention. It will be apparent, however, to one skilled in the art that these specific details need not be employed to practice the present invention. In other instances, well known materials, machines, or methods have not been described in detail in order to avoid unnecessarily obscuring the present invention.

A common characteristic of processes for manufacturing MEMS devices is that they begin with the deposition of a stack of thin films which are crucial to the operation and subsequent fabrication of the device. These precursor films are useful in the fabrication of a broad variety of MEMs devices including interferometric modulators, and their deposition can occur as a part of a larger process to manufacture the MEMS device. In one embodiment of the present invention the films are deposited separately in a stand alone facility to form a precursor stack, which is then sent to multiple facilities which complete the processing. The primary benefit is that the stand alone facility can be optimized to produce these films or precursor stacks at very high throughputs that allow for economies of scale not possible in an integrated factory, i.e., one that does both the deposition and post-deposition processing. Furthermore, since the technology development of the precursor stack occurs at the stand alone facility, entities which desire to perform the subsequent processing steps are faced with a lower technological barrier to entry.

Patent application Ser. No. 10/074,562 herein incorporated by reference describes a prototypical fabrication sequence for building interferometric modulators. In general, interferometric modulator fabrication sequences and categories of sequences are notable for their simplicity and cost effectiveness. This is due in large part to the fact that all of the films are deposited using physical vapor deposition (PVD) techniques with sputtering being the preferred and least expensive of the approaches. Part of the simplicity derives from the fact that all interferometric modulator structures, and indeed many other planar MEMS structures are bound by the fact that they require a lower electrode, an insulating structure to prevent shorting, a sacrificial material, and an actuatable or movable structure. An insulating structure differs from a film in that it is not continuous in its form but by mechanical means is able to prevent electrical contact through its body. This fact presents an opportunity in that a subset of these films, a precursor stack comprising one or more of the lower electrode, insulating structure, the sacrificial layer, and optionally an actuatable structure may be manufactured separately and in advance of the actuatable structure or structures.

Figure 1:
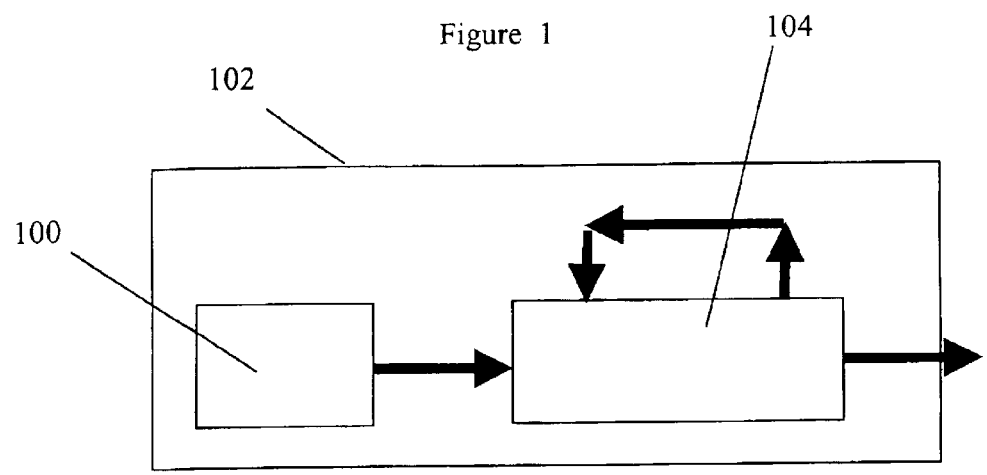
FIG. 1 shows a block diagram of an integrated MEMS processing facility.

FIG. 1 of the drawings provides a block diagram of an integrated MEMS fabrication facility 102. A precursor film deposition tool 100, comprises a single or series of deposition tools which are configured to deposit these films using one or more deposition techniques, e.g., sputtering. The films are deposited on a suitable carrier substrate, which could be glass or plastic, for example, depending on the application, and subsequently transported to micromachining loop 104. Here, and as described in the aforementioned patent applications, a sequence of repeated steps, such as etching, patterning, and deposition, are performed and serve to define the actuatable structure of the MEMS device.

Figure 2:
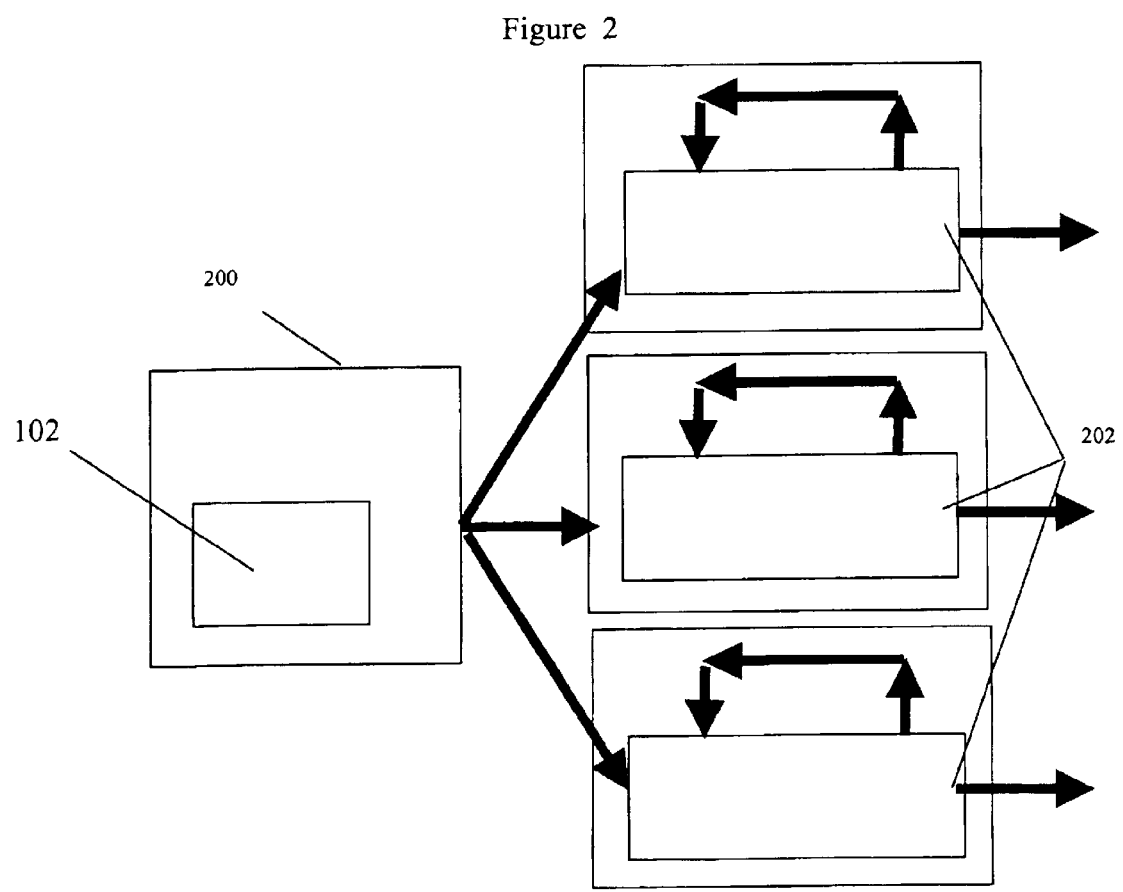
FIG. 2 shows a block diagram of a non-integrated MEMS processing facility.

FIG. 2 of the drawings shows a non-integrated MEMS processing facility. Referring to FIG. 2, a pre-cursor facility 200 contains only a precursor film deposition tool 100 which is equivalent to that described in FIG. 1, hence the use of the same reference numeral. The facility 200 is capable of providing variations on both precursor film type and substrate size. After the deposition, the substrates are containerized and shipped as appropriate to one or more processing facilities indicated by reference numeral 202. These facilities then perform the machining steps as required for the particular MEMS product that they are designed to produce.

Figure 3:
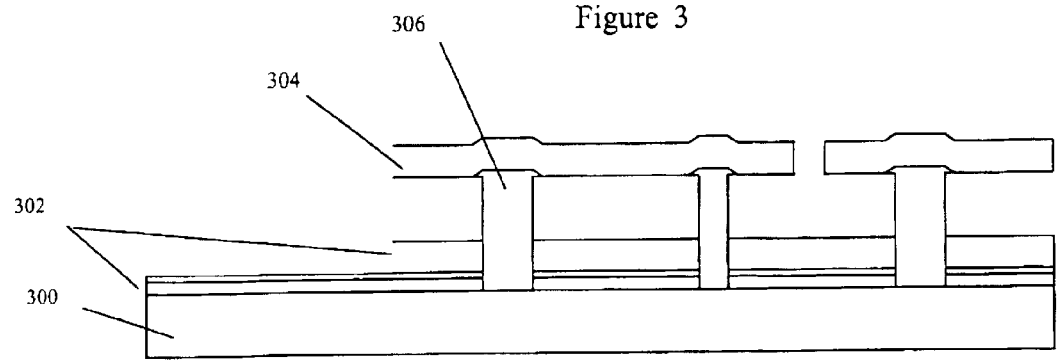
FIG. 3 shows a block diagram of a MEMS device which can be fabricated using a precursor stack of the present invention.

FIG. 3 shows a schematic drawing of a simple MEMS device which can be fabricated using a precursor stack of the present invention. In this case an actuatable membrane 304, is supported on posts 306. Films 302 comprise materials which at a minimum provide a lower electrode and an insulating structure, though other functions, as will be discussed, may be incorporated. The entire assembly resides on a substrate 300.

FIGS. 4A to 4F of the drawings show block diagrams of precursor stacks in accordance with different embodiments of the invention. In FIGS. 4A to 4F, the same reference numerals have been used to identify the same or similar features/components.

Figure 4A:
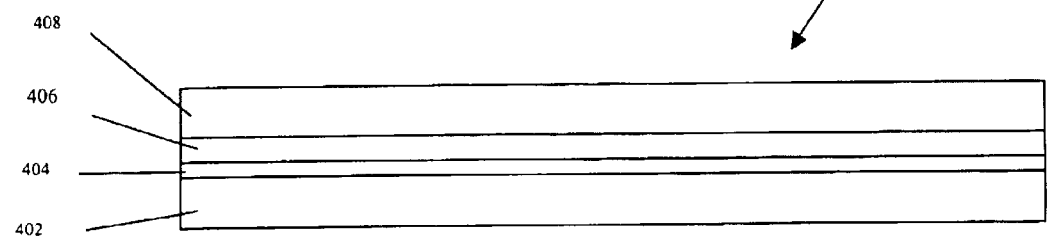
FIGS. 4A to 4F show block diagrams of precursor stacks of the present invention, according to different embodiments.
Figure 4B:
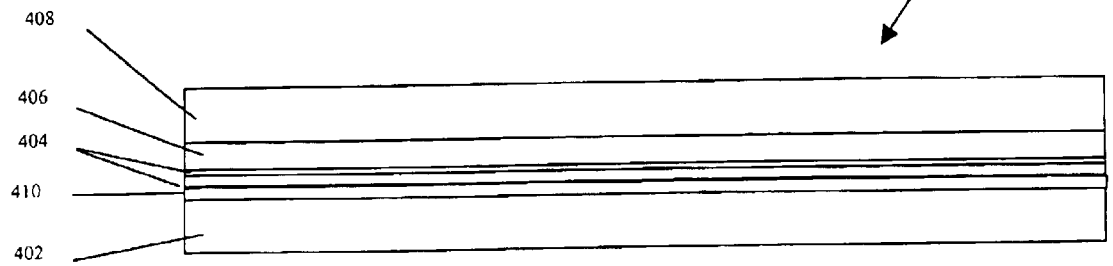

FIG. 4B shows a block diagram of a generalized precursor stack 400A that includes conductor stack or structure 404, an insulator layer 406, and a sacrificial material layer 408. All the films reside on a substrate 402. The conductor stack 404 may comprise a single metal, a conductive oxide or polymer, a fluoride, a silicide or combinations of these materials. The exact composition of the conductive stack is determined by the requisite electrode properties of the MEMS device to be manufactured. The insulator 408, can be any one or a combination of a variety of insulating materials which include but are not limited to oxides, polymers, fluorides, ceramics, and nitrides. The sacrificial material 408, may include, for example, a single layer of materials such as silicon, molybdenum, or tungsten which are all etchable by XeF2, which is a process etch gas that has been described in prior patents. Other materials are possible subject to the compatibility of the etching medium to the materials and structures which must remain. Thicknesses vary according to the requisite behavior of the final device.

FIG. 4B shows a block diagram of a precursor stack 400B designed for use in the fabrication of an interferometric modulator device. The stack 400B includes a conductor stack 404, the composition of which has been described above. Suitable metals for the conductor stack 404 in the present case include glossy metals such as Chromium, Tungsten, Molybdenum, or alloys thereof. The conductor stack 404 may have a thickness of up to 150 angstroms. Transparent conductors suitable for use in the conductor stack 404 include indium tin oxide (ITO), zinc oxide (ZnO), and titanium nitride (TiN). Typical thicknesses for the transparent conductors range from 100 to 800 angstroms. The conductor stack 404 resides on a transparent compensating oxide layer 410, in one embodiment. The oxide layer 410 may be of a metallic oxide, such as zirconia (ZrO2) or hafnia (HfO2), which have a finite extinction coefficient within the visible range. The compensating oxide layer 410 is an optional film for all the designs discussed in this patent application. Typical thicknesses for the oxide layer 410 range from 100 to 800 angstroms. It should be noted that the positions of the conductor stack 404 and the compensating oxide layer 410 are interchangeable with only subtle changes in the optical behavior. This design, however, can be considered an embedded optical film design since the metal, which plays the primary optical function, resides on the side of insulator layer 406, opposite that of the sacrificial layer 408. The insulator layer 406, may comprise a silicon dioxide film with a thickness ranging from 280 to 840 angstroms for good black states, although other thicknesses are useful for different interference modulator operational modes. Other oxides or combinations of oxides are possible as well. The sacrificial layer 408 may include a single layer of materials such as silicon, molybdenum, tungsten, for example, which are all etchable by XeF2, a process etch gas which has been described in prior patents. For the stack 400B, the thickness of the layer 408 may vary from 1000, to 7000 angstroms.

Figure 4C:
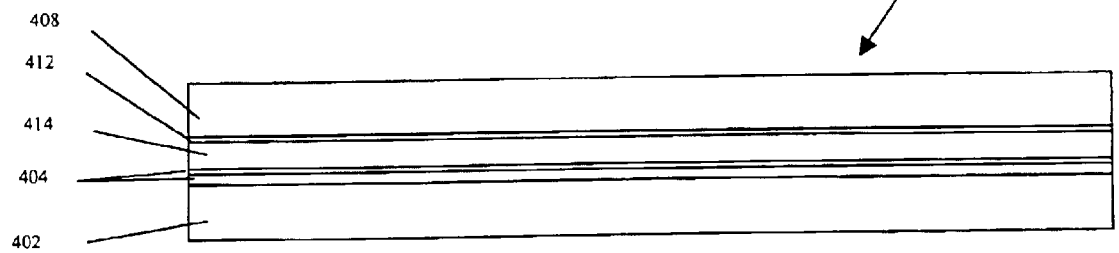

FIG. 4C shows a block diagram of a precursor stack 400C, in accordance with another embodiment. In this case, the conductor stack 404 does not perform any optical functions. Instead, a separate optical film 412 performs the optical function. The optical film 412 is separated from the conductor stack 404 by an insulator film or structure 414. This design allows for high quality white states to be achieved when the actuatable membrane is driven. In this case the optical film 412 does not serve as a conductor. It is the transparent conductor stack 404 which functions as a conductor. An ancilliary insulator film or structure which is not shown in FIG. 4C but which is similar to the insulator layer 406 of FIG. 4B, may reside between the sacrificial layer 408 and the optical film 412, in some embodiments. The thickness of the insulator film or structure may be less than 100 angstroms for this design.

Figure 4D:
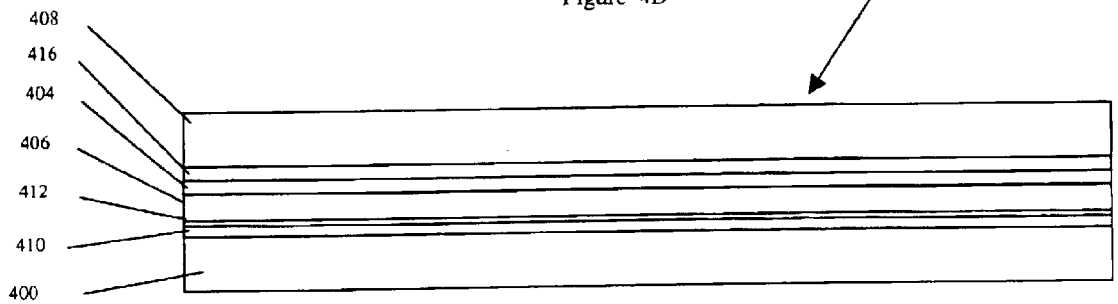

FIG. 4D shows an embodiment 400D of a precursor stack, known as a buried optical film design. In this case, an optical film 412, resides over an optical compensation film 410, which resides below an insulator film/structure 406. A transparent conductor film or film stack 404, follows and is capped by an additional oxide layer 416, and a sacrificial film layer 408. One advantage of the stack 400D is that it allows for the effective optical distance between the optical film 412 and the mechanical film to be large while allowing the driving voltages to remain small. This is because the driving voltages are significantly determined by the distance between the conductor and the actuatable membrane.

Figure 4E:
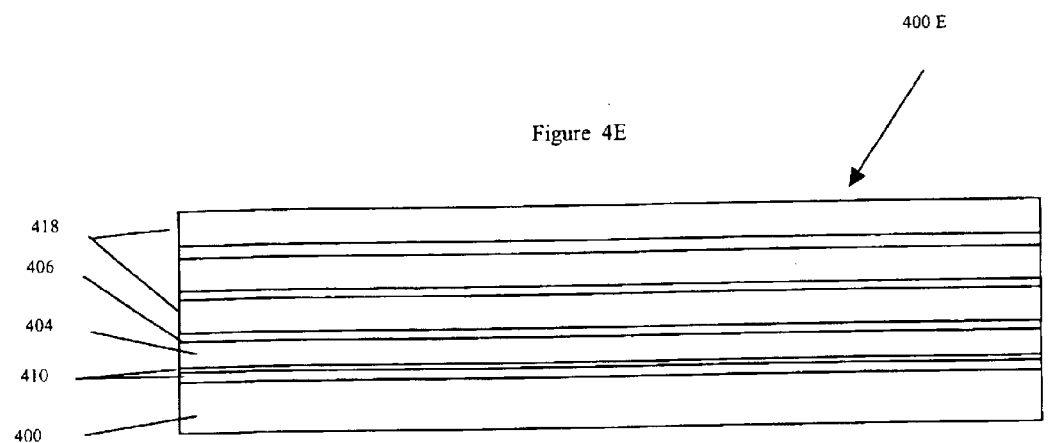

FIG. 4E shows a precursor stack 400E which includes a multi-layer etch stop stack 418 incorporated instead of a single layer sacrificial film. This 418 stack provides a convenient means for predefining the heights for multiple actuatable structures to be defined during subsequent micromachining processes. In one embodiment, the stack 418 comprises at least two materials which can be etched using the same release etch, but can utilize alternative and different etch chemistries so that one material may act as an etch stop for the other. One example would be a combination of molybdenum and silicon that are both etchable in XeF2. However, a phosphoric based wet etchant may be used to etch molybdenum without attacking silicon, and a tetramethyl-ammonium hydroxide (TMMA) which may be used to etch silicon without etching molybdenum. Many other combinations exist and can be identified and exploited by those skilled in the art. Further, it should be noted that the etch stop stack may be applied to any of the previously defined precursor stacks in place of the single sacrificial layer.

Figure 4F:
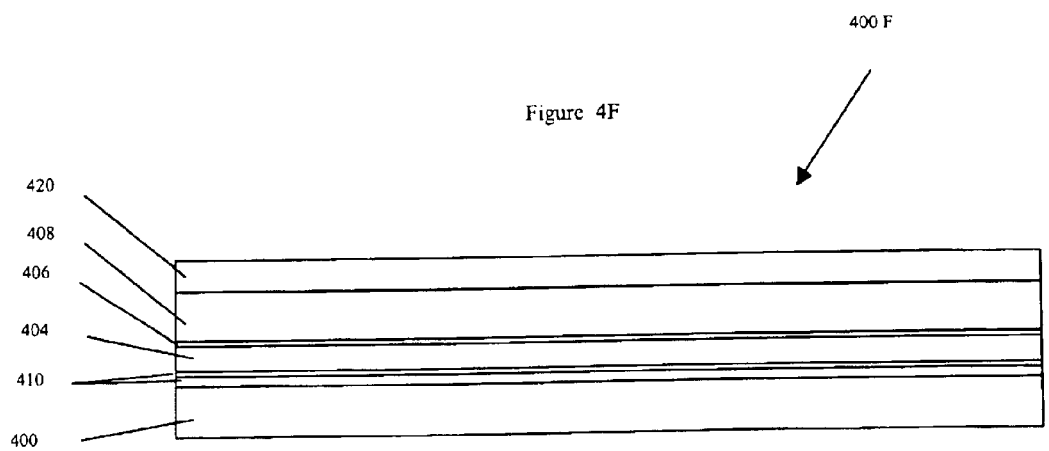

FIG. 4F of the drawings shows an embodiment 400F of a precursor stack The precursor stack 400F includes a mechanical structural material 420. Using proper micromachining techniques and sequences, a functioning MEM device may be fabricated using the precursor stack 400F using only patterning and etching. Thus, during post-processing of the precursor stack 400F no deposition is required. This means that a post-processing facility such as the facility 202 (see FIG. 2) does not require capital investment in deposition tools. The material 420 may comprise any number of materials, including but not limited to metals, polymers, oxides, and combinations thereof, whose stress can be controlled.

What is claimed is:

1. A precursor film stack for use in the production of MEMS devices, the precursor film stack comprising:

a carrier substrate;

an optical compensation layer formed over the carrier substrate, the optical compensation layer comprising a material of a finite extinction coefficient;

a first layer formed on the optical compensation layer;

a second layer of an insulator material formed over the first layer; and a third layer of a sacrificial material formed on the second layer.

2. The stack of claim 1, wherein the first, the second and the third layers are formed using a deposition technique.

3. The stack of claim 1, wherein the first layer comprises a conductive material selected from the group comprising a single metal, a conductive oxide, a fluoride, a silicide, and a conductive polymer.

4. The stack of claim 1, wherein the insulator material is selected from the group comprising an oxide, a polymer, a fluoride, a ceramic and a nitride.

5. The stack of claim 1, wherein the sacrificial material is etchable using a Xenon difluoride gas.

6. The stack of claim 1, wherein the sacrificial material is selected from the group comprising silicon, molybdenum, and tungsten.

7. The stack of claim 1, wherein the optical compensation layer comprises a material comprising at least one of the following: Zirconia, and Hafnia.

8. The stack of claim 1, wherein the first layer comprises a plurality of sublayers, at least some of the sublayer comprising a conductive material.

9. The stack of claim 8, wherein the sublayer furthest from the carrier substrate is non-conductive and defines an optical layer.

10. The stack of claim 1, further comprising an optical layer deposited between the second and third layers.

11. The stack of claim 10, wherein the optical layer comprises a substantially non-conductive material.

12. The stack of claim 1, wherein the third layer comprises at least two sublayers, each sublayer alternating with the other, wherein each sublayer can be etched by the same release etchant, but has a different etch chemistry so that the sublayers define etch stops for each other.

13. The stack of claim 12, wherein the third layer comprises a sublayer of molybdenum that alternates with a sublayer of silicon.

14. The stack of claim 1, wherein the optical compensation layer comprises a material comprising at least one of the following: an oxide, a nitride, and a fluoride.

15. The stack of claim 1, wherein the first layer comprises at least one of Chromium, Tungsten, and Molybdenum.

16. The stack of claim 1, wherein the first layer comprises at least one of indium tin oxide (ITO), zinc oxide (ZnO), and titanium nitride (TiN).

17. A precursor film stack for use in the production of MEMS devices, the precursor film stack comprising:
    a carrier substrate;
    a first layer formed on the carrier substrate, the first layer comprising a plurality of sublayers, wherein at least one of the sublayers comprises a conductive material;
    a second layer of an insulator material formed on the first layer; and
    a third layer of a sacrificial material formed on the second layer.

18. The stack of claim 17, wherein the sublayer furthest from the carrier substrate is non-conductive and defines an optical device.

19. A precursor film stack for use in the production of MEMS devices, the precursor film stack comprising:
    a carrier substrate;
    a first layer formed on the carrier substrate;
    a second layer comrpising an insulator material formed on the first layer; and
    a third layer comprising a sacrificial material formed on the second layer, wherein the third layer comprises at least two sublayers, each sublayer alternating with the other, wherein each sublayer is etched by the same release etchant, but has a different etch chemistry from the other, wherein the sublayers define etch stops for each other.

20. The stack of claim 19, wherein the third layer comprises a sublayer of molybdenum that alternates with a sublayer of silicon.

21. A method of making a precursor film stack for use in the production of MEMS devices, the method comprising:
    providing a substrate;
    forming an optical compensation layer over the substrate, the optical compensation layer comprising a material of a finite extinction coefficient;
    forming a first layer on the optical compensation layer;
    forming a second layer of an insulator material over the first layer; and
    forming a third layer of a sacrificial material on te second layer.

22. The method of claim 21, wherein the first layer comprises a conductive material comprising at least one of the following: a single metal, a conductive oxide, a fluoride, a silicide, or a conductive polymer.

23. The method of claim 21, wherein the first layer comprises a plurality of sublayers, at least one of the sublayers comprising a conductive material.

24. The method of claim 23, wherein the sublayer furthest from the substrate comprises a non-conductive material and defines an optical layer.

25. The method of claim 21, further comprising depositing an optical layer between the second and third layers.

26. The method of claim 21, wherein the third layer comprises at least two sublayers, each sublayer alternating with the other to define etch stops for each other.

27. The method of claim 26, wherein the third layer comprises a sublayer of molybdenum that alternates with a sublayer of silicon.

28. The method of claim 21, wherein the optical compensation layer comprises a material comprising at least one of the following: Zirconia and Hafnia.

29. The method of claim 21, wherein the optical compensation layer comprises a material comprising at least one of the following: an oxide, a nitride, and a fluoride.

* * * * *

UNITED STATES PATENT AND TRADEMARK OFFICE
CERTIFICATE OF CORRECTION

| | | |
|---|---|---|
| PATENT NO. | : 7,221,495 B2 | |
| APPLICATION NO. | : 10/606001 | |
| DATED | : May 22, 2007 | |
| INVENTOR(S) | : Miles et al. | |

It is certified that error appears in the above-identified patent and that said Letters Patent is hereby corrected as shown below:

Page 1, Column 1, Line 6, delete "Maimer," and insert --Malmer,--.

Page 1, Column 1, Line 10, delete "4,198,396" and insert --4,196,396--.

Page 1, Column 2, Line 10, delete "FL." and insert --FL,--.

Page 2, Column 1, Line 48, delete "250/200.2" and insert --250/208.2--.

Page 3, Column 2, Line 28, delete "6870681" and insert --6870581--.

Page 4, Column 1, Line 20, delete "Techniques,"" and insert --Techniques",--.

Page 4, Column 1, Line 23, delete ""Comparsion" and insert --"Comparison--.

Page 4, Column 1, Line 35, delete "Optics" and insert --Optic--.

Page 4, Column 1, Line 40, delete "4-9," and insert --4-9.--.

Page 4, Column 2, Line 8, delete "terahentz" and insert --terahertz--.

Page 4, Column 2, Line 12, delete "Wavelenghts" and insert --Wavelengths--.

Page 4, Column 2, Line 34, delete "vapor," and insert --vapor.--.

Page 4, Column 2, Line 42-43, delete "Electromechical" and insert --Electromechanical--.

Column 1, Line 24 (Approx.), after "No." delete "No.".

Column 3, Line 31, delete "The" and insert --An optical compensation layer may comprise the--.

Column 3, Line 31, delete "410" and insert --410, which--.

Column 3, Line 49, delete "well." and insert --well. In another embodiment, the optical compensation layer may comprise a material such as a nitride or a fluoride.--.

Column 5, Line 13 (Approx.), In Claim 7, delete "Zirconia," and insert --Zirconia--.

Column 5, Line 15 (Approx.), In Claim 8, delete "sublayer" and insert --sublayers--.

UNITED STATES PATENT AND TRADEMARK OFFICE
CERTIFICATE OF CORRECTION

PATENT NO. : 7,221,495 B2
APPLICATION NO. : 10/606001
DATED : May 22, 2007
INVENTOR(S) : Miles et al.

It is certified that error appears in the above-identified patent and that said Letters Patent is hereby corrected as shown below:

Column 5, Line 53 (Approx.), In Claim 18, delete "device." and insert --layer.--.

Column 6, Line 5, In Claim 19, delete "comrpising" and insert --comprising--.

Column 6, Line 26 (Approx.), In Claim 21, delete "te" and insert --the--.

Signed and Sealed this

Twelfth Day of August, 2008

JON W. DUDAS
*Director of the United States Patent and Trademark Office*